US006737853B2

(12) United States Patent
Wilsher et al.

(10) Patent No.: US 6,737,853 B2
(45) Date of Patent: May 18, 2004

(54) PHOTOCONDUCTIVE-SAMPLING VOLTAGE MEASUREMENT

(75) Inventors: Kenneth R. Wilsher, Palo Alto, CA (US); Francis Ho, Palo Alto, CA (US)

(73) Assignee: NPTest, LLC, San Jose, CA (US)

( * ) Notice: Subject to any disclaimer, the term of this patent is extended or adjusted under 35 U.S.C. 154(b) by 0 days.

(21) Appl. No.: 10/004,018

(22) Filed: Oct. 18, 2001

(65) Prior Publication Data

US 2003/0076122 A1 Apr. 24, 2003

(51) Int. Cl.$^7$ ............................................. G01R 31/00
(52) U.S. Cl. ........................................................ 324/96
(58) Field of Search ............................... 324/750, 752, 324/754, 96

(56) References Cited

U.S. PATENT DOCUMENTS

| | | | |
|---|---|---|---|
| 4,030,840 A | | 6/1977 | Lawton et al. |
| 5,142,224 A | * | 8/1992 | Smith et al. ................ 324/765 |
| 5,317,256 A | | 5/1994 | Williamson |
| 5,331,275 A | | 7/1994 | Ozaki et al. |
| 5,399,978 A | | 3/1995 | De Kort et al. |
| 5,442,300 A | | 8/1995 | Nees et al. |
| 5,638,005 A | * | 6/1997 | Rajan et al. ................ 324/751 |
| 5,929,643 A | * | 7/1999 | Sakai et al. ................ 324/750 |
| 6,614,214 B2 | | 9/2003 | Mizuhara et al. |

OTHER PUBLICATIONS

J. Kim et al., *Photoconductive sampling probe with 2.3–ps temporal resolution and 4μV sensitivity*, App. Phys. Lett. 62(18), May 3, 1993, pp. 2268–2270.

* cited by examiner

*Primary Examiner*—Evan Pert
*Assistant Examiner*—Emily Y Chan
(74) *Attorney, Agent, or Firm*—Bruce D. Riter

(57) ABSTRACT

A method of probing voltage comprises: establishing electrical connectivity between a conductor to be probed and a first terminal of a photoconductive switch; during a sampling interval n, applying a laser pulse to the photoconductive switch while applying a voltage to a second terminal of the photoconductive switch corresponding to a voltage sample taken during a prior sampling interval n−1, such that current flow through the photoconductive switch is dependent on any difference between voltage of the conductor and the applied voltage; converting the current flow to a voltage signal; passing the voltage signal during a gating interval and sampling the passed voltage signal to produce a voltage sample for the sampling interval n. A repetitive test pattern applied to the conductor and the sampling interval is synchronized with the repetitive test pattern. Converting the current flow to a voltage signal can comprise applying the current flow to a current-to-voltage converter having a rise time which is less than the gating interval. The voltage signal can be passed only during the gating interval so that the voltage sample is insensitive to any leakage through the photoconductive switch outside of the gating interval. Passing the voltage signal during a gating interval can comprise applying the voltage signal to a first transistor Q1 of a differential pair of transistors Q1, Q2, applying a reference voltage to a second transistor Q2 of the differential pair of transistors, and controlling common emitter current of the differential pair of transistors with an electronic switch so as to pass the voltage signal when the electronic switch is closed. Sampling the voltage signal can comprises applying the voltage signal to an analog-to-digital converter and enabling the analog-to-digital converter to prepare a digital sample of the voltage signal representing voltage on the conductor. Apparatus for carrying out the method is also provided.

13 Claims, 5 Drawing Sheets

PHOTOCONDUCTIVE-SAMPLING VOLTAGE MEASUREMENT

BACKGROUND OF THE INVENTION

1. Field of the Invention

The present invention relates to acquisition of voltage measurements with a photoconductive sampling probe.

2. The Prior Art

A prior-art sampling probe has a contact tip and a high-impedance photoconductive gate fabricated as an electrode structure on a substrate. To sample voltages on a conductor of a device under test (DUT), the contact tip is applied to the conductor and an optical probe laser beam is pulsed to close the gate. See J. KIM et al., Photoconductive sampling probe with 2.3-ps temporal resolution and 4 $\mu$V sensitivity, APPL. PHYS. LETT. 62(18), May 3, 1993, pp. 2268–2270. A system employing such a probe is described in U.S. Pat. No. 5,317,256 dated May 31, 1996 to Williamson. See also U.S. Pat. No. 5,331,275 dated Jul. 19, 1994 to Ozaki et al., and U.S. Pat. No. 5,442,300 dated Aug. 15, 1995 to Nees et al.

In an ideal photoconductive (PC) switch, the dark-resistance (when the laser pulse is off) is infinite, so that the rest of the sampling circuit is electrically connected to the DUT only when the laser pulse is on. For such an ideal PC switch, one operating method is to keep the output side of the PC switch at a fixed voltage (say 0 V) and to measure the net charge passed by the switch over an entire trigger period, where the trigger period is the product of the length of a repetitive stimulus-signal loop applied to the DUT and the clock period of the loop. A simple calibration allows this net charge to be interpreted as voltage.

FIG. 1 shows an equivalent-circuit view of an ideal prior-art PC sampling system. The DUT is represented as a voltage source 100 connected to the input terminal of a PC switch 105 which has a resistance 110 when closed of some value $R_{on}$, such as 50 k$\Omega$. The current Ipc through PC switch 105 and resistance 110 $R_{on}$ is applied to the input of a current-to-voltage converter made up of a differential amplifier 115 and a feedback resistance 120 having a value R. The converter output voltage is thus $V_{out} = R \cdot I_{pc}$.

FIG. 2 illustrates. A trigger pulse occurs once for each repetition of a stimulus-signal pattern applied to the DUT, as shown in line 200. A laser sampling pulse is produced at some time after the trigger pulse as shown in line 205. The ideal PC switch responds to the laser sampling pulse by changing resistance from $R_{off}=\infty$ to $R_{on}=50$ k$\Omega$, as shown in line 210. Voltage on a conductor of the DUT to be sampled is shown at line 215. The result of closing the PC switch in response to the laser sampling pulse is a signal $V_{out}$, as shown in line 220. The integral under $V_{out}$ for each optical sampling pulse is proportional to the sampled DUT voltage.

In practice, it has been observed that although the equilibrium dark-resistance of the PC switch $R_{off}$ is usually greater than several hundred megohms, the "dark-resistance" $R_{off}$ is much lower immediately following a laser pulse. In one experiment, the dark-resistance $R_{off}$ was found to be approximately 50 M$\Omega$ for a few microseconds following a laser pulse. This "persistent photoconductivity" (PPC) effect will cause the net charge through the PC switch to be contaminated by the DUT voltage acting through the reduced dark-resistance $R_{off}$ for a few microseconds following the laser pulse, whereas accurate measurement demands that the net charge passed by the PC switch be sensitive only to the DUT voltage during the laser pulse interval.

An equivalent circuit is shown in FIG. 3. At a laser pulse repetition rate of 500 KHz, rather than having an infinite resistance when open, the PC switch is found to have a dark-resistance 300 of $R_{off}=50$ M$\Omega$. FIG. 4 illustrates. A trigger pulse occurs once for each repetition of a stimulus-signal pattern applied to the DUT, as shown in line 400. A laser sampling pulse is produced at some time after the trigger pulse as shown in line 405. The non-ideal PC switch of FIG. 3 responds to the laser sampling pulse by changing resistance from $R_{off}=50$ M$\Omega$ to $R_{on}=50$ k$\Omega$ as shown in line 410.

A first example of voltage $V_{DUT1}$ on a conductor of the DUT to be sampled is shown at line 415—in this example, the voltage is at a high level during much of the interval between trigger pulses, except for a negative-going pulse 435 just prior to the laser sampling pulse 440. Closing the PC switch in response to the laser sampling pulse results in a signal $V_{out1}$, as shown in line 420. A second example of voltage $V_{DUT2}$ on a conductor of the DUT to be sampled is shown at line 425—in this example, the voltage is at a low level during the interval between trigger pulses. Closing the PC switch in response to the laser sampling pulse results in a signal $V_{out2}$, as shown in line 430. The differences between lines 420 and 430 illustrate a problem with PC switch leakage. The integrated areas under $V_{out1}$ and $V_{out2}$ are not identical, even though the voltages $V_{DUT1}$ and $V_{DUT2}$ are the same at the sampling point.

PC switches also have other non-ideal characteristics which can lead to measurement errors. These include non-linear on-resistance (the conduction current saturates at high bias voltages) and temperature sensitivity. When the effect of the dark-resistance can be neglected, it is simple to avoid such errors: a hold-capacitor is charged up through the PC switch, so that when the voltage on the capacitor has reached equilibrium, that voltage is exactly equal to the DUT voltage at the time of the laser pulse, irrespective of non-linear on-resistances or temperature variations.

FIG. 5 shows an equivalent-circuit of a hold-capacitor sampling system for absolute voltage measurement with an ideal PC switch. The DUT is represented as a voltage source 500 connected to the input terminal of a PC switch 505 which has a resistance 510 when closed of $R_{on}$. The current Ipc through PC switch 505 and resistance 510 $R_{on}$ is applied to a hold-capacitor $C_{hold}$ which is connected across the input terminals of a high-impedance amplifier 520. Ideally, if leakage currents can be neglected, the voltage on $C_{hold}$ will charge exactly to the DUT voltage at the sampling point. The action of the hold-capacitor can be viewed as negative feedback. When the dark-resistance $R_{off}$ cannot be neglected, such a simple system will give erroneous voltage measurements due to current flow through the dark-resistance.

In addition to the above-noted limitations, the operating voltage range of high impedance input stages is usually limited. There is thus a need for improved methods and circuits of photoconductive voltage sampling.

SUMMARY OF THE INVENTION

In accordance with an embodiment of the invention, methods of probing voltage comprise: establishing electrical connectivity between a DUT conductor to be probed and a photoconductive switch; during a sampling interval n, applying a laser pulse to the photoconductive switch while applying a voltage to the photoconductive switch terminal that is not connected to the DUT, corresponding to a voltage sample taken during a prior sampling interval n−1, such that current flow through the photoconductive switch is dependent on any difference between voltage of the DUT conductor and the applied voltage; converting the current flow to a voltage signal; passing the voltage signal during a gating interval $T_{elec}$, and sampling the passed voltage signal to produce a voltage sample for the sampling interval n.

A repetitive test pattern is applied to the conductor, and the sampling interval is synchronized with the repetitive test pattern. Converting the current flow to a voltage signal can comprise applying the current flow to a current-to-voltage converter having a rise time which is less than the gating interval $T_{elec}$. The voltage signal can be passed only during the gating interval so that the voltage sample is insensitive to any leakage through the photoconductive switch outside of the gating interval. Passing the voltage signal during a gating interval can comprise applying the voltage signal to a first transistor $Q_1$ of a differential pair of transistors $Q_1, Q_2$, applying a reference voltage to a second transistor $Q_2$ of the differential pair of transistors, and controlling common emitter current of the differential pair of transistors with an electronic switch so as to pass the voltage signal when the electronic switch is closed. Sampling the voltage signal comprises applying the differential voltage signal from $Q_1$, $Q_2$ to an analog-to-digital converter and enabling the analog-to-digital converter to prepare a digital sample of the voltage signal representing the voltage on the conductor.

Also in accordance with an embodiment of the invention, apparatus for probing voltage on a conductor comprises: a photoconductive switch responsive to laser pulses; a probe tip for establishing electrical connectivity between a conductor to be probed and the photoconductive switch; a source for applying a laser pulse to the photoconductive switch during a sampling interval n; a circuit for applying to the photoconductive switch during the sampling interval n a voltage corresponding to a voltage estimate, $V_{OUT}$, produced from prior samples, n−1, n−2, n−3, etc., such that current flow through the photoconductive switch is dependent on any difference between the voltage of the conductor at sample interval n and the voltage estimate $V_{OUT}$; a current-to-voltage converter for converting the current flow to a voltage signal; a gate for passing the voltage signal during a gating interval; and a sampling circuit for sampling the passed voltage signal to produce a voltage difference or voltage error sample for the sampling interval n, the voltage estimate $V_{out}$ for sample n+1 being formed by the summation of the voltage estimate of this voltage error and $V_{out}$ for sample n.

The apparatus can further comprise a timing circuit for synchronizing the sampling interval with a repetitive signal pattern appearing on the conductor. The current-to-voltage converter preferably has a rise time which is less than the gating interval. The gate preferably passes a voltage signal only during the gating interval $T_{elec}$ so that the voltage sample is insensitive to any leakage through the photoconductive switch outside of the gating interval. The gate preferably comprises a differential pair of transistors Q1, Q2, the voltage signal being applied to a first transistor Q1 of the differential pair and a reference voltage being applied to a second transistor Q2 of the differential pair, and the differential pair having common emitter current controlled by an electronic switch so as to pass the voltage signal when the electronic switch is closed. The sampling circuit preferably comprises an analog-to-digital converter for preparing a digital sample of the voltage signal representing the difference between $V_{OUT}$ at sampling interval n−1 and the voltage on the conductor at sampling interval n. The output of this analog-to-digital converter is applied to digital summing device, the output of the summing device being a digital representation of $V_{OUT}$ to be used in the next sampling interval n+1. The output of the summing device is applied to the digital-to-analog converter to produce the new $V_{OUT}$.

As noted above, the PPC effect leads to distortions in the measured waveform. This problem is addressed in accordance with embodiments of the present invention in the use of an electronically-gated measurement technique. In another aspect, the present invention provides a technique for increasing the input voltage range. These and other features of the invention will become apparent to those of skill in the art from the following description and the accompanying drawing figures.

DETAILED DESCRIPTION

In accordance with an aspect of the present invention, the PPC effect can be compensated by measuring as quickly as possible the charge that flows during the turn-on of the PC switch by a laser pulse. In other words, the measurement of charge is gated to avoid measuring the charge flow due to the dark-resistance leakage. If the duration of this gated measurement is short enough, there will not be sufficient time for the dark-resistance to significantly corrupt the measurement.

Assume, for example, that a laser sampling pulse turns the PC switch on for a time $T_{samp}$=50 ps with on-resistance $R_{on}$=50 kΩ and dark-resistance $R_{off}$=50 MΩ, the trigger period is $T_{trig}$=1 μs, the DUT voltage at the time of the laser sampling pulse is $V_s$, and the average DUT voltage over the trigger period is $V_{av}$ (it is assumed that $V_{av} \approx V_s$). Then the ratio of the error charge to the signal charge is $$(V_{av}/V_s)*(R_{on}/R_{off})*(T_{trig}/T_{samp})=2000\% \text{ error!}$$

Assume instead that an electronic switch is used to gate the charge measurement, an electronic switch which is slower than the PC switch, and that the on-time of the electronic switch $T_{elec}$=2.5 ns. Then the error percentage is given by $$(V_{av}/V_s)*(R_{on}/R_{off})*(T_{elec}/T_{samp})=5\% \text{ error.}$$

Accurate voltage measurements are obtained in accordance with the invention, despite PC switch conductance effects which are nonlinear with respect to bias voltage and are temperature sensitive. A nulling technique using feedback is employed, in which error between the feedback voltage and the sampled DUT voltage is detected and applied to correct the feedback voltage. Such a nulling technique has the further advantage of reducing the invasiveness of the probe: minimal charge will flow during the laser sampling pulse when the impedance of the PC switch is low, when the nulling voltage is equal to the sampled DUT voltage. This feedback is implemented in an embodiment of the invention using a DC-blocking, series capacitor, which has the additional benefit of working with an input voltage range that can be much larger than the operating range of the high-speed input amplifier stage.

Figure 6:
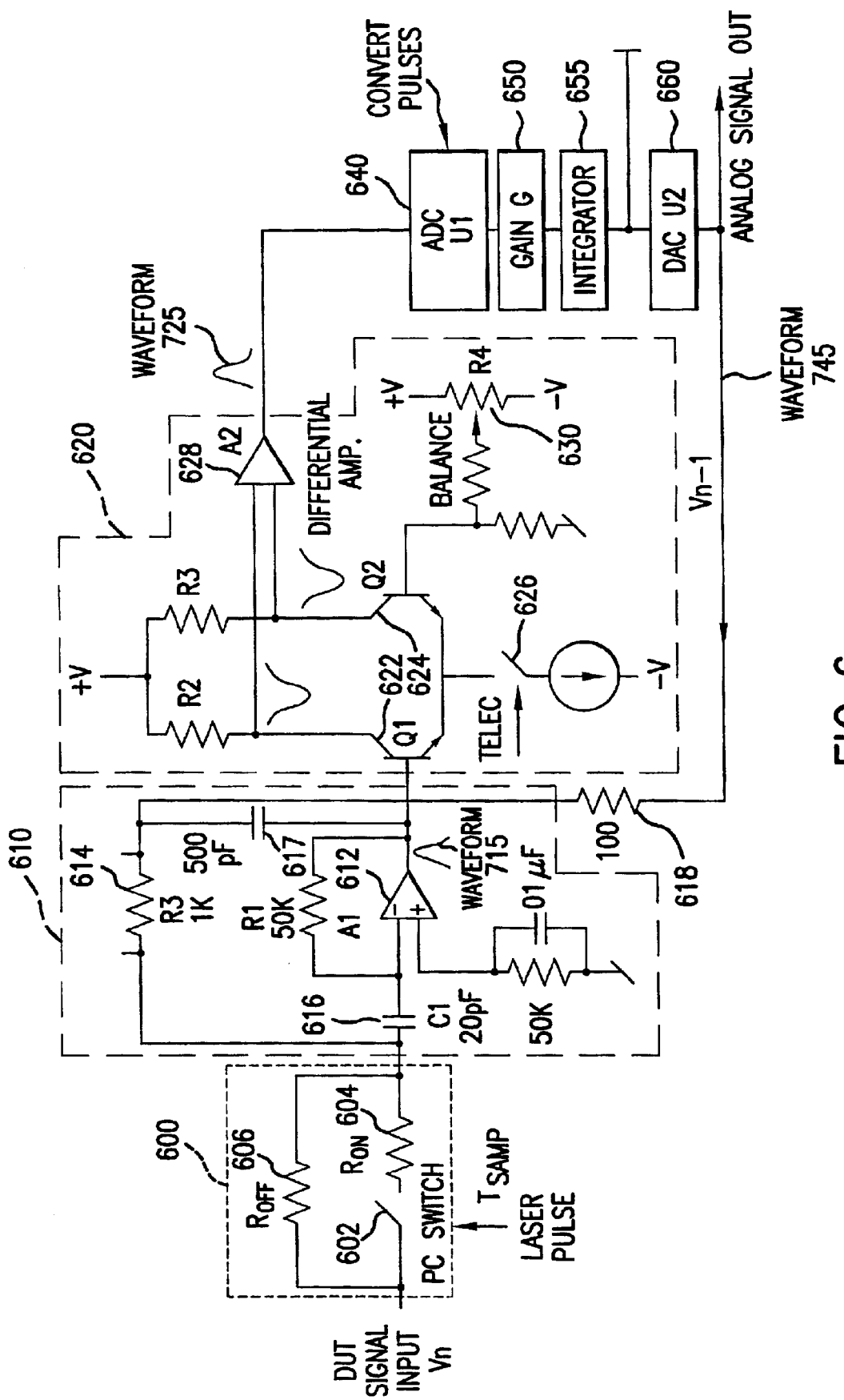
FIG. 6 is a schematic diagram of a PC sampling calibration circuit in accordance with the invention.

FIG. 6 is a schematic diagram of a PC sampling calibration circuit in accordance with the invention. A PC switch 600 is shown as an equivalent circuit including an ideal switch 602, PC-switch on-resistance 604 $R_{on}$ and PC-switch dark-resistance 606 $R_{off}$. PC switch 600 feeds a current-to-voltage converter 610 made up of an amplifier 612 ($A_1$) having a shunt feedback resistor 614 ($R_3$) of low value such that its current-to-voltage conversion has a high bandwidth—such that the rise time of the current-to voltage converter 610 is less than $T_{elec}$. Capacitors 616 ($C_1$) and 617 are also provided, the purpose of which is discussed below. PC switch 600 is turned on for only a few tens of picoseconds.

Assume that at sample number n the voltage on a DUT will produce a voltage $V_n$ on the input side of PC switch 600. A previous sample n−1 resulted in a voltage $V_{n-1}$ on the output of DAC 660 and hence on the output side of PC switch 600 via resistors 618 and 614. Assume voltage $V_{n-1}$ is not equal to voltage $V_n$. During sample n a signal current flows through PC switch 600 and causes a voltage impulse 715 to appear at the output of amplifier 612 ($A_1$) which is a few nanoseconds wide. The length of the impulse is short such that the voltages across capacitors 617 and 616 do not change substantially during it.

The signal from current-to-voltage converter 610 is supplied to a gate circuit 620. A differential pair of transistors 622 ($Q_1$), 624 ($Q_2$) have their common emitter current controlled by an electronic switch 626. Switch 626 is closed for a short time $T_{elec}$ during which signal impulse 715 appears at the output of amplifier 612 ($A_1$). By this means any following signal detection circuits are made insensitive to leakage through dark-resisitance $R_{off}$ of PC switch 600 when electronic switch 626 is open.

Closing electronic switch 626 by turning on the common emitter current causes large negative impulses to appear at the collectors of differential-transistor pair 622 ($Q_1$), 624 ($Q_2$). These negative impulses are applied to respective input lines of a differential amplifier 628 ($A_2$). The difference between these negative impulses appearing at the output line of differential amplifier 628 ($A_2$) as a signal impulse 725 is an amplified version of signal impulse 715 at the output amplifier 612 ($A_1$). Differential amplifier 628 ($A_2$) rejects the common-mode impulse and amplifies only the difference signal. The charge injection that is unavoidable with electronic switches such as switch 626 will also appear as a common-mode signal, and will therefore be rejected by differential amplifier 628 ($A_2$). Potentiometer 630 ($R_4$) is used to balance the amplifier circuitry to compensate for transistor mismatches and offset voltages. With the arrangement shown, the collector circuit of differential-transistor pair 622 ($Q_1$), 624 ($Q_2$) and differential amplifier 628 ($A_2$) need not have high bandwidths.

Signal impulse 725 from differential amplifier 628 ($A_2$) is supplied to an analog-to-digital converter 640 (ADC $U_1$). ADC 640 ($U_1$) converts signal impulse 725 to digital data which is held on its output registers until the next sample. The output data from ADC 640 ($U_1$) is digitally multiplied by a factor, loop gain G, in a loop gain control 650. The digital output of 650 is applied to numerical integrator 655 which stores the sum of all the previous samples from gain control 650. The output from integrator 655 is converted to a voltage by digital-to-analog converter 660 (DAC $U_2$). Provision is made to allow adjustment of gain G, so that a step change in the DUT voltage between two successive samples will result in essentially the same step change in the output voltage 745 of DAC 660. Output voltage 745 is fed back to current-to-voltage converter 610 and appears across DC blocking capacitor 616 ($C_1$). The input of amplifier 612 remains at ground potential. It is thus possible to have a large input voltage range without compromising the design of the critical high-speed input stage comprising amplifier 612 ($A_1$).

Figure 1:
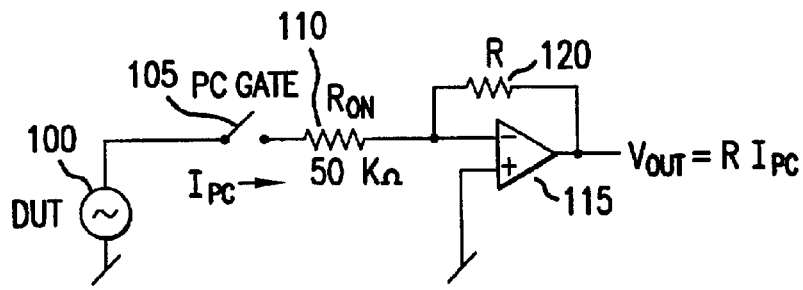
FIG. 1 shows an equivalent-circuit of an ideal prior-art PC sampling system.
Figure 2:
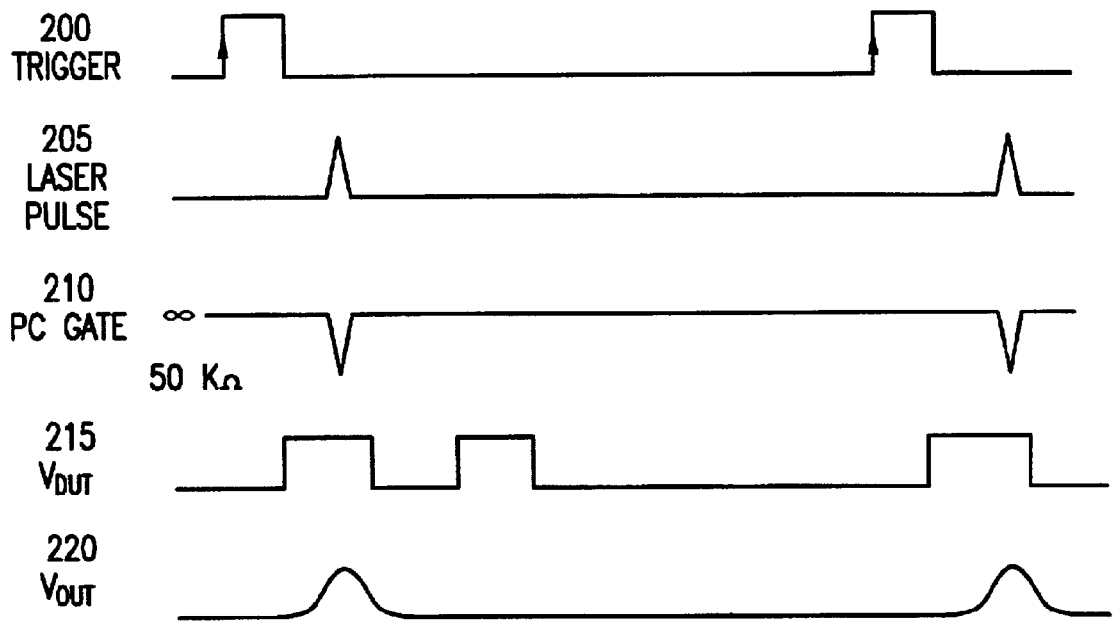
FIG. 2 is a timing diagram illustrating PC gate leakage in the circuit of FIG. 1.
Figure 3:
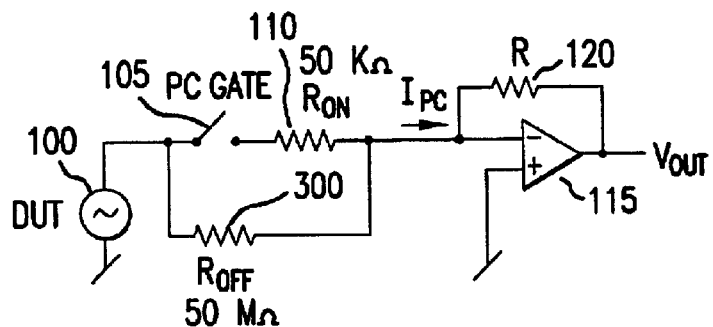
FIG. 3 shows an equivalent-circuit of persistent photoconductivity in a PC sampling system.
Figure 4:
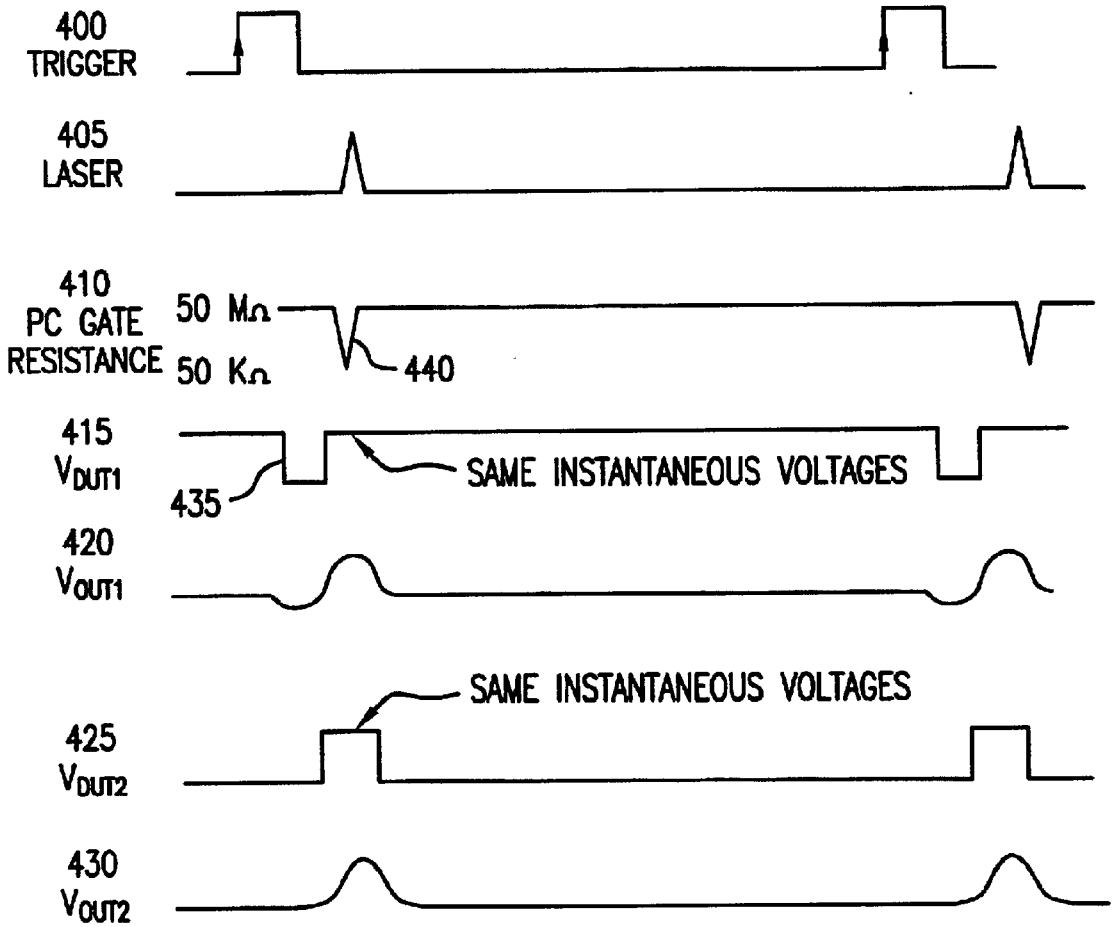
FIG. 4 is a timing diagram illustrating the effect of persistent photoconductivity in the circuit of FIG. 3.
Figure 5:
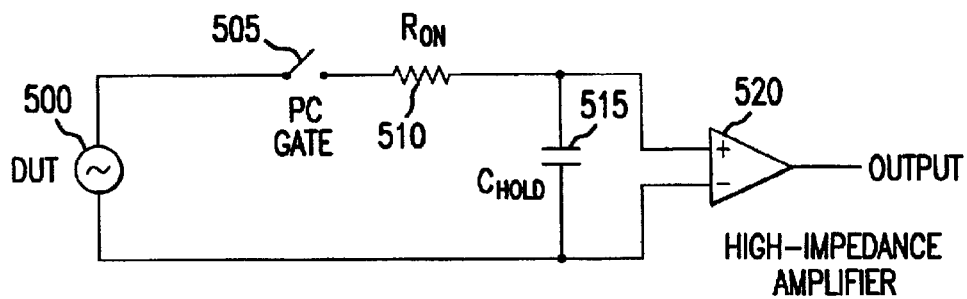
FIG. 5 illustrates a method of absolute voltage measurement with an ideal PC gate.
Figure 7:
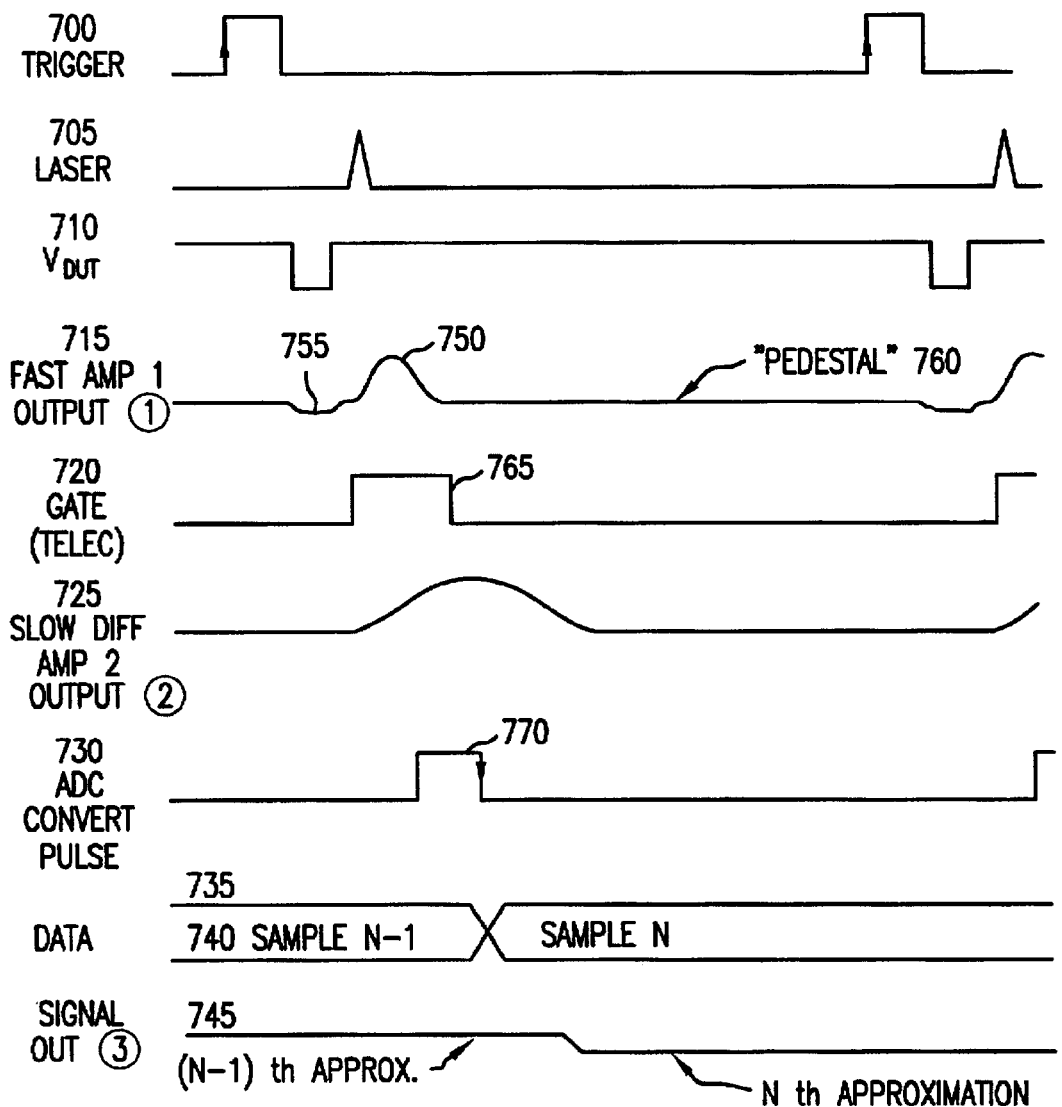
FIG. 7 is a timing diagram illustrating operation of the circuit of FIG. 6.

Operation of the circuit of FIG. 6 is illustrated by the timing diagram of FIG. 7. Line 700 shows the trigger pulses signaling the repetitions of a stimulus pattern applied to the DUT. Line 705 shows timing of laser sampling pulses applied to PC switch 600 in synchrony with the trigger pulses. Line 710 shows the voltage $V_{DUT}$ on a conductor of the DUT, with a negative-going pulse shortly before each laser sampling pulse. Line 715 shows the signal at the output of amplifier 612, with a sample pulse 750 preceded by a dip 755 due to the negative-going pulse on the DUT, and a "pedestal" 760 of elevated voltage following pulse 750 resulting from leakage through PC switch 600. Line 720 shows the interval 765 ($T_{elec}$) during which electronic switch 626 is closed, allowing sample pulse 750 to pass to gate 620. The portion of pedestal 760 that is outside the $T_{elec}$ gating interval is not passed by gate 620 and thus has no effect on the final data. Line 725 shows the output of relatively slow differential amplifier 628 ($A_2$). Line 730 shows the pulses which signal ADC 640 ($U_1$) to convert the signal impulse at the output of amplifier 628 to digital data. The digital output of ADC 640 ($U_1$) is shown at line 740: the output is updated with each conversion pulse of line 730. For example, the output of ADC 640 ($U_1$) represents a sample n−1 until the downgoing edge of conversion pulse 770, and then changes to represent the subsequent sample n. As shown at line 745, the output voltage from DAC 660 ($U_2$) is an approximation of the voltage sample taken from the the DUT and is updated with each new sample. For example, the signal at 745 is an approximation of the (n−1)$^{th}$ sample while the n$^{th}$ sample is taken, and then is updated to be an approximation of the n$^{th}$ sample before the (n+1)$^{th}$ sample is taken.

Figure 8:
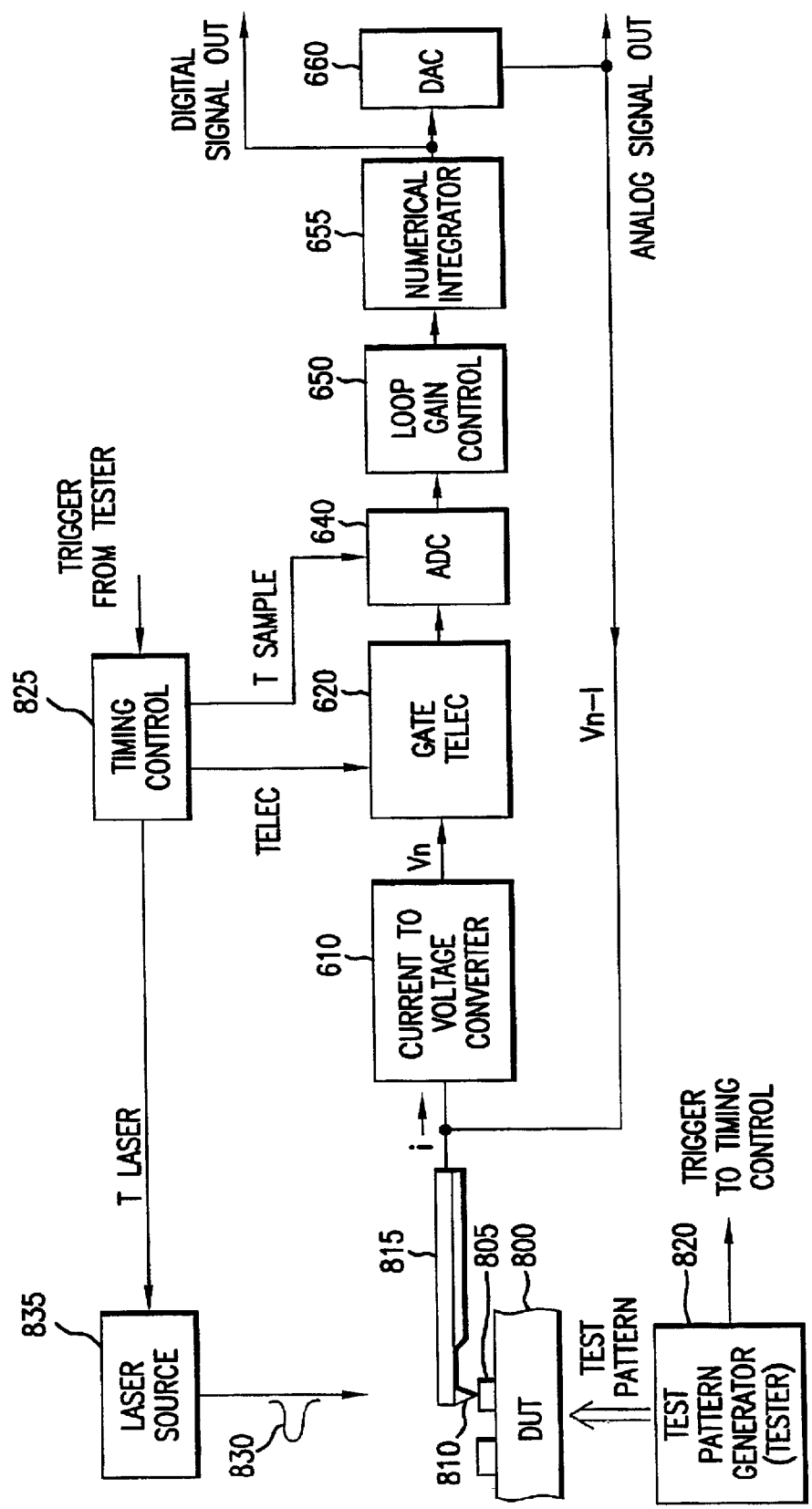
FIG. 8 is a schematic diagram of a system for photoconductive sampling of voltage on a DUT in accordance with the invention.

FIG. 8 is a schematic diagram of a system for photoconductive sampling of voltage on a DUT in accordance with the invention. A DUT 800 has a conductor 805 to which the contact tip 810 of a PC probe 815 is applied. PC probe 815 includes a PC switch such as PC switch 600. A test pattern generator 820 applies a repetitive stimulus pattern to DUT 800 to cause voltage patterns to appear on the conductors of the DUT. Test pattern generator 820 also supplies a trigger pulse sequence, such as shown at line 700 of FIG. 7, to a system timing controller 825. Timing controller 825 assures synchronization of laser sampling pulses 830 from a laser source 835 as shown at line 705 of FIG. 7, and also the timing of gate 620 as shown at line 720 of FIG. 7 and the timing of ADC conversion pulses as shown at line 730 of FIG. 7.

Those of skill in the art will recognize that these and other modifications can be made within the spirit and scope of the invention as defined in the claims which follow.

What is claimed is:

1. A method of probing voltage, comprising:
   a. establishing electrical connectivity between a conductor to be probed and a first terminal of a photoconductive switch,
   b. during a sampling interval n, applying a laser pulse to the photoconductive switch while applying a voltage to a second terminal of the photoconductive switch corresponding to a voltage sample taken during a prior sampling interval n−1, such that current flow through the photoconductive switch is dependent on any difference between voltage of the conductor and the applied voltage,
   c. converting the current flow to a voltage signal,
   d. passing the voltage signal during a gating interval $T_{elec}$, and
   e. sampling the passed voltage signal to produce a voltage sample for the sampling interval n.

2. The method of claim 1, further comprising the steps of applying a repetitive test pattern to the conductor and synchronizing the sampling interval with the repetitive test pattern.

3. The method of claim 1, wherein the conversion of the current flow to a voltage signal comprises applying the current flow to a current-to-voltage converter having a rise time which is less than the gating interval $T_{elec}$.

4. The method of claim 1 wherein the voltage signal is passed only during the gating interval $T_{elec}$ so that the voltage sample is insensitive to any leakage through the photoconductive switch outside of the gating interval $T_{elec}$.

5. The method of claim 1 wherein passing the voltage signal during a gating interval comprises applying the voltage signal to a first transistor Q1 of a differential pair of transistors Q1, Q2, applying a reference voltage to a second transistor Q2 of the differential pair of transistors, and controlling common emitter current of the differential pair of transistors with an electronic switch so as to pass the voltage signal when the electronic switch is closed.

6. The method of claim 1, wherein sampling the voltage signal comprises applying the voltage signal to an analog-to-digital converter and enabling the analog-to-digital converter to prepare a digital sample of the voltage signal representing voltage on the conductor.

7. Apparatus for probing voltage on a conductor, comprising:
   a. a photoconductive switch responsive to laser pulses and having a first terminal and a second terminal,
   b. a probe tip for establishing electrical connectivity between a conductor to be probed and the first terminal,
   c. a source for applying a laser pulse to the photoconductive switch during a sampling interval n,
   d. a circuit for applying to the second terminal during the sampling interval n a voltage corresponding to a voltage sample taken during a prior sampling interval n−1, such that current flow through the photoconductive switch is dependent on any difference between voltage of the conductor and the applied voltage,
   e. a current-to-voltage converter for converting the current flow to a voltage signal,
   f. a gate for passing the voltage signal during a gating interval $T_{elec}$, and
   g. a sampling circuit for sampling the voltage signal passed by the gate to produce a voltage sample for the sampling interval n.

8. The apparatus of claim 7, further comprising a timing circuit for synchronizing the sampling interval with a repetitive signal pattern appearing on the conductor.

9. The apparatus of claim 7, wherein the current-to-voltage converter has a rise time which is less than the gating interval $T_{elec}$.

10. The apparatus of claim 7, wherein the gate passes the voltage signal only during the gating interval $T_{elec}$ so that the voltage sample is insensitive to leakage through the photoconductive switch outside of the gating interval $T_{elec}$.

11. The apparatus of claim 7, wherein the gate comprises a differential pair of transistors Q1, Q2, the voltage signal being applied to a first transistor Q1 of the differential pair and a reference voltage being applied to a second transistor Q2 of the differential pair, and the differential pair having common emitter current controlled by an electronic switch so as to pass the voltage signal when the electronic switch is closed.

12. The apparatus of claim 7, wherein the sampling circuit comprises an analog-to-digital converter for preparing a digital sample of the voltage signal representing voltage on the conductor.

13. The apparatus of claim 7, wherein the current-to-voltage converter has an input coupled to receive current flow from the photoconductive switch terminal via a DC-blocking capacitor.

* * * * *